United States Patent
Mawatari et al.

(10) Patent No.: US 6,559,691 B2
(45) Date of Patent: May 6, 2003

(54) VOLTAGE LEVEL CONVERTING CIRCUIT

(75) Inventors: Hiroshi Mawatari, Kawasaki (JP); Motoko Tanishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/966,086

(22) Filed: Oct. 1, 2001

(65) Prior Publication Data

US 2002/0180494 A1 Dec. 5, 2002

(30) Foreign Application Priority Data

May 30, 2001 (JP) ........................................ 2001-162987

(51) Int. Cl.[7] .................................................. H03B 1/00
(52) U.S. Cl. ........................................ 327/108; 327/112
(58) Field of Search ................................ 327/108, 112, 327/333; 326/62, 68, 80, 81

(56) References Cited

U.S. PATENT DOCUMENTS

| | | | |
|---|---|---|---|
| 4,506,164 A | * 3/1985 | Higuchi | ........................ 326/81 |
| 4,672,243 A | * 6/1987 | Kirsch | ........................ 326/71 |
| 4,926,070 A | * 5/1990 | Tanaka et al. | ................. 326/81 |
| 6,384,632 B2 | * 5/2002 | Tsuji | ........................... 326/58 |

FOREIGN PATENT DOCUMENTS

JP            6-6205            1/1994

* cited by examiner

Primary Examiner—Timothy P. Callahan
Assistant Examiner—Linh Nguyen
(74) Attorney, Agent, or Firm—Arent Fox Kintner Plotkin & Kahn, PLLC

(57) ABSTRACT

An Nch-Tr having a gate connected to an input terminal and an Nch-Tr having a gate connected to an output signal voltage supply terminal through a Pch-Tr are connected to an output terminal for outputting an output signal carrying a second voltage level. In changing the output signal from a high level to a low level in accordance with a change of an input signal carrying a first voltage level, both the Nch-Trs are initially turned ON to lower the voltage of the output signal, and then the Nch-Tr having its gate connected to the output signal voltage supply terminal through the Pch-Tr is brought into a high ON state (a state of higher driving power) to turn the voltage of the output signal to the low level, so that the output signal can be changed quickly by a simple circuit configuration.

10 Claims, 6 Drawing Sheets

VOLTAGE LEVEL CONVERTING CIRCUIT

CROSS-REFERENCE TO RELATED APPLICATIONS

This application is based upon and claims priority of Japanese Patent Application No. 2001-162987, filed on May 30, 2001, the contents being incorporated herein by reference.

BACKGROUND OF THE INVENTION

Field of the Invention

The invention relates to a semiconductor circuit, and is particularly suitably applicable to a semiconductor circuit for converting an input signal into different levels of signals for output.

Description of the Related Art

Conventionally, there have been some semiconductor integrated circuits which use a power supply voltage and a voltage different from the power supply voltage. Such memory circuits as a dynamic random access memory (DRAM) and a flash memory have supplied their word lines with a high voltage different from the power supply voltage.

For example, in a DRAM, memory cells have a lower threshold voltage $V_{TH}$ if they are composed of N-channel transistors. Therefore, a high voltage above the power supply voltage is supplied to word lines to read stored data from the memory cells. To take another example, a flash memory supplies a high voltage above the power supply voltage (for instance, a voltage of 5 to 6 V in the case of a power supply voltage of 2 V) to its word lines, bit lines, and source lines to rewrite (erase and write) data to be stored into memory cells.

Figure 5:
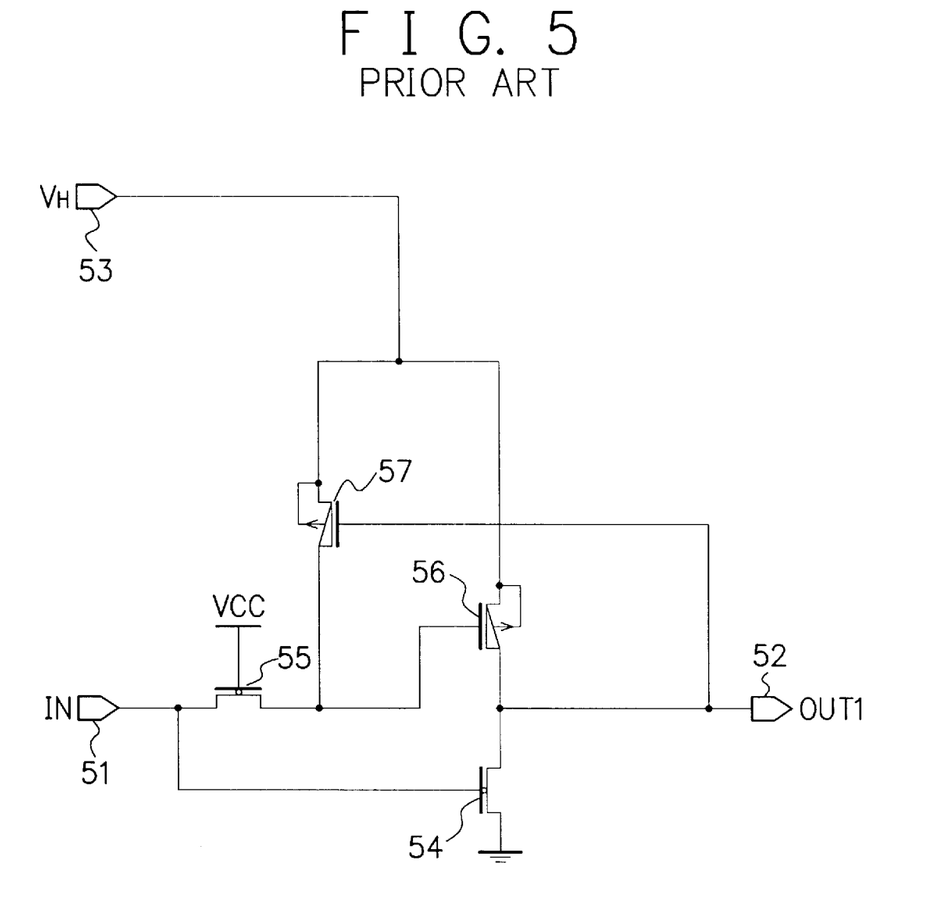
FIG. 5 is a diagram showing the configuration of a switching circuit in a conventional semiconductor integrated circuit.

These semiconductor integrated circuits using a voltage different from their power supply voltage contain switching circuits as shown in FIG. 5, thereby switching the signal levels of predetermined signals to voltage levels different from the power supply voltage.

FIG. 5 is a diagram showing the configuration of a switching circuit to be implemented in a conventional semiconductor integrated circuit.

In FIG. 5, the reference numeral 51 designates an input terminal for inputting an input signal IN, 52 an output terminal for outputting an output signal OUT1, and 53 an output signal voltage supply terminal for supplying an output signal voltage $V_H$ different from a power supply voltage VCC ($V_H$>VCC). The reference numerals 54 and 55 designate N-channel transistors (hereinafter, referred to a N-channel transistor as "Nch-Tr"), and the numerals 56 and 57 P-channel transistors (hereinafter, referred to a P-channel transistor as "Pch-Tr").

The input terminal 51 is connected to the gate of the Nch-Tr 54 and the source of the Nch-Tr 55. The Nch-Tr 54 is connected at its source to a reference voltage VSS (in FIG. 5, a ground potential). The Nch-Tr 55 is connected at its gate to the power supply voltage VCC. The drain of the Nch-Tr 54 and the drain of the Pch-Tr 56 are connected with each other. To the interconnection node, the output terminal 52 and the gate of the Pch-Tr 57 are connected.

The drain of the Nch-Tr 55 and the drain of the Pch-Tr 57 are connected to each other. To the interconnection node is connected the gate of the Pch-Tr 56. In addition, the source of the Pch-Tr 56 and the source of the Pch-Tr 57 are connected to the output signal voltage supply terminal 53.

In the switching circuit shown in FIG. 5 described above, an input signal IN carrying the power supply voltage VCC (high level) is input through the input terminal 51 to turn ON the Nch-Tr 54. This lowers the potential of the interconnection node between the drain of the Nch-Tr 54 and the drain of the Pch-Tr 56, turning ON the Pch-Tr 57 which is connected at its gate to the interconnection node. This turns OFF the Pch-Tr 56 which is connected at its gate to the drain of the Pch-Tr 57. Accordingly, when the input signal IN carrying the power supply voltage VCC (high level) is input, the Nch-Tr 54 turns ON and the Pch-Tr 56 turns OFF so that an output signal OUT1 carrying the reference voltage VSS (low level) is output through the output terminal 52.

On the other hand, an input signal IN carrying the reference voltage VSS (low level) is input through the input terminal 51 to turn OFF the Nch-Tr 54. This also lowers the potential of the interconnection node between the drain of the Nch-Tr 55 and the drain of the Pch-Tr 57, turning ON the Pch-Tr 56 which is connected at its gate to the interconnection node. The Pch-Tr 57 accordingly turns OFF. Therefore, when the input signal IN carrying the reference voltage VSS (low level) is input, the Nch-Tr 54 turns OFF and the Pch-Tr 56 turns ON so that an output signal OUT1 carrying the output signal voltage $V_H$ (high level) is output through the output terminal 52.

In this way, the switching circuit shown in FIG. 5 has switched the signal level of a signal input from the power supply voltage level to the output signal voltage level different from the power supply voltage for output.

In the conventional switching circuit shown in FIG. 5, however, the Nch-Tr 54 and the Pch-Tr 56 temporarily coincide in an ON state when the input signal IN changes from the reference voltage VSS (low level) to the power supply voltage VCC (high level). On that account, the switching circuit described above deteriorates in switching characteristics, requiring a great deal of time before the output signal OUT1 output from the switching circuit changes from the output signal voltage $V_H$ (high level) to the reference voltage VSS (low level).

Moreover, in the switching circuit shown in FIG. 5, the transistor size ratio between the Nch-Tr 54 and the Pch-Tr 56 constituting this switching circuit has a profound effect on the switching characteristics. Therefore, to improve the switching characteristics of the switching circuit, it is required that the Nch-Tr and Pch-Tr be designed after determination of an optimum transistor size ratio. Nevertheless, even if the optimum transistor size ratio between the Nch-Tr and Pch-Tr is determined and the switching circuit is designed accordingly, the switching circuit can deviate in switching characteristics when the power supply voltage VCC and the output signal voltage $V_H$ have greater amplitudes. For this reason, the switching characteristics have been difficult to control.

Figure 6:
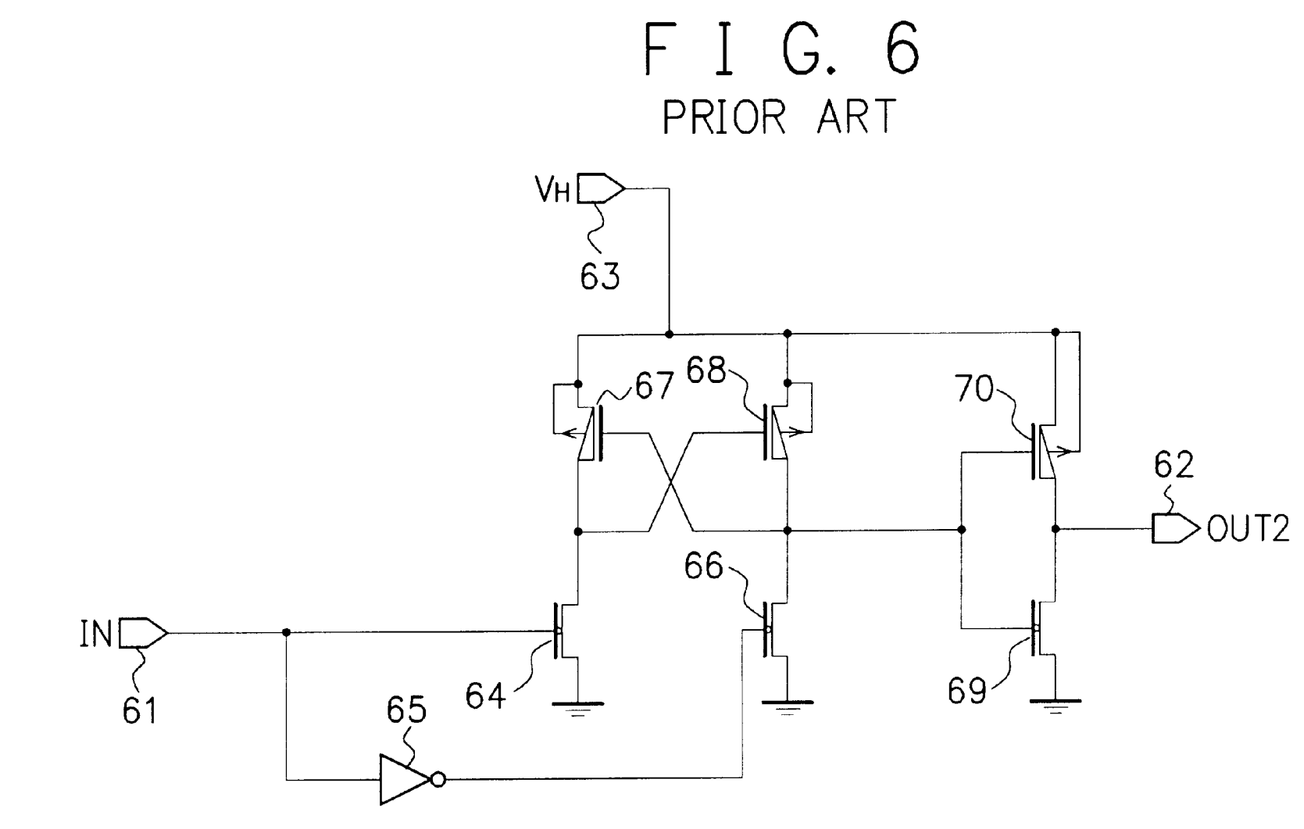
FIG. 6 is a diagram showing another configuration of the switching circuit in a conventional semiconductor integrated circuit.

For a solution to such problems, there has been a method of adopting a switching circuit as shown in FIG. 6 for a semiconductor integrated circuit using a voltage different from the power supply voltage, so that the signal level is switched from the power supply voltage level to a voltage level different from the power supply voltage.

FIG. 6 is a diagram showing another configuration of the switching circuit to be implemented in a conventional semiconductor integrated circuit.

In FIG. 6, the reference numerals 64, 66, and 69 designate Nch-Trs, and 67, 68, and 70 Pch-Trs. The Nch-Trs 64, 66, and 69 are connected to a reference voltage VSS (ground potential) at their respective sources. The Pch-Trs 67, 68, and 70 are connected at their respective sources to an output signal voltage supply terminal 63 for supplying an output signal voltage $V_H$ ($V_H$ >power supply voltage VCC). An input terminal 61 for inputting an input signal IN is connected to the gate of the Nch-Tr 64 and the input of an inverter 65. The output of the inverter 65 is connected to the gate of the Nch-Tr 66.

The drain of the Nch-Tr 64 and the drain of the Pch-Tr 67 are connected to each other. The gate of the Pch-Tr 68 is connected to the interconnection node. Similarly, the drain of the Nch-Tr 66 and the drain of the Pch-Tr 68 are connected to each other. To the interconnection node is connected the gate of the Pch-Tr 67. That is, the Nch-Trs 64 and 66, the Pch-Trs 67 and 68, and the inverter 65 constitute a level shift circuit in which an input signal IN input through the input terminal 61 is shifted to the output signal voltage $V_H$ in signal level and output with its logic kept intact.

The interconnection node between the drain of the Nch-Tr 66 and the drain of the Pch-Tr 68 is also connected with the gate of the Nch-Tr 69 and the gate of the Pch-Tr 70. The drain of the Nch-Tr 69 and the drain of the Pch-Tr 70 are connected to each other. An output terminal 62 for outputting an output signal OUT2 is connected to the interconnection node.

In the switching circuit shown in FIG. 6 described above, the input signal IN input through the input terminal 61 is shifted in signal level by the level shift circuit consisting of the Nch-Trs 64 and 66, the Pch-Trs 67 and 68, and the inverter 65, so that a signal identical to the input signal IN in logic but not in signal level is output from the interconnection node between the drain of the Nch-Tr 66 and the drain of the Pch-Tr 68. Accordingly, when an input signal IN carrying the power supply voltage VCC (high level) is input, a signal carrying the output signal voltage $V_H$ (high level) is supplied to the gates of the Nch-Tr 69 and Pch-Tr 70. This turns the Nch-Tr 69 ON and the Pch-Tr 70 OFF, whereby an output signal OUT2 carrying the reference voltage VSS (low level) is output through the output terminal 62.

In contrast, when an input signal IN carrying the reference voltage VSS (low level) is input, a signal carrying the reference voltage VSS (low level) is supplied to the gates of the Nch-Tr 69 and Pch-Tr 70. This turns the Nch-Tr 69 OFF and the Pch-Tr 70 ON, whereby an output signal OUT2 carrying the output signal voltage $V_H$ (high level) is output through the output terminal 62.

In switching the signal level of an input signal IN from the power supply voltage level to a voltage level different from the power supply voltage by using the switching circuit shown in FIG. 6, the Nch-Trs 64 and 66 are exclusively driven by the power supply voltage VCC while the Nch-Tr 69 and the Pch-Trs 67, 68, and 70 are driven by the output signal voltage $V_H$. This allows the output signal OUT2 to be quickly switched and output as the input signal IN is changed. Thus, the switching circuit shown in FIG. 6 has switching characteristics superior to those of the switching circuit shown in FIG. 5.

The switching circuit shown in FIG. 6, however, greatly increases in the number of circuit elements as compared to the switching circuit shown in FIG. 5. Specifically, the switching circuit shown in FIG. 5 consists of four transistors. On the other hand, the switching circuit shown in FIG. 6 consists of not less than eight transistors, assuming that the inverter 65 is composed of at least two transistors. As a result, the switching circuit shown in FIG. 6 has had a problem of greater circuit area (layout area) with an increasing number of circuit elements. In particular, there has been a problem of extremely greater circuit area (layout area) when the switching circuit shown in FIG. 6 is incorporated into such circuits as a decoder circuit in which identical circuit configurations are laid out repeatedly.

SUMMARY OF THE INVENTION

The present invention has been achieved to solve the foregoing problems. It is thus an object of the present invention to provide a semiconductor circuit of smaller circuit area which can offer favorable switching characteristics in switching signal voltage levels.

A semiconductor circuit according to the present invention comprises: an input terminal capable of inputting an input signal of binary logic to be represented by a first voltage or a reference voltage; an output terminal capable of outputting an output signal to be represented by a second voltage or the reference voltage, corresponding to the logic of the input signal; a voltage supply terminal for supplying the second voltage; a first N-channel transistor having a gate connected to the input terminal, a drain connected to the output terminal, and a source connected to a reference voltage supply terminal for supplying the reference voltage; and a second N-channel transistor having a drain connected to the output terminal, a source connected to the reference voltage supply terminal, and a gate connectable to the input terminal and the voltage supply terminal. Here, the first voltage is applied to the gates of the first and second N-channel transistors before the second voltage is applied to the gate of the second N-channel transistor to output an output signal represented by the second voltage or the reference voltage through the output terminal.

According to the present invention having the configuration described above, the application of the first voltage to the gates of the first and second N-channel transistors turns ON the first and second N-channel transistors, putting the signal level of the output signal into a predetermined level. Then, the application of the second voltage to the gate of the second N-channel transistor can bring the second N-channel transistor into a high ON state (a state of higher driving power) to turn the output signal into the second voltage or the reference voltage in signal level.

DETAILED DESCRIPTION OF THE PREFERRED EMBODIMENTS

The embodiments of the present invention will be described below with reference to the drawings.

First Embodiment

Figure 1:
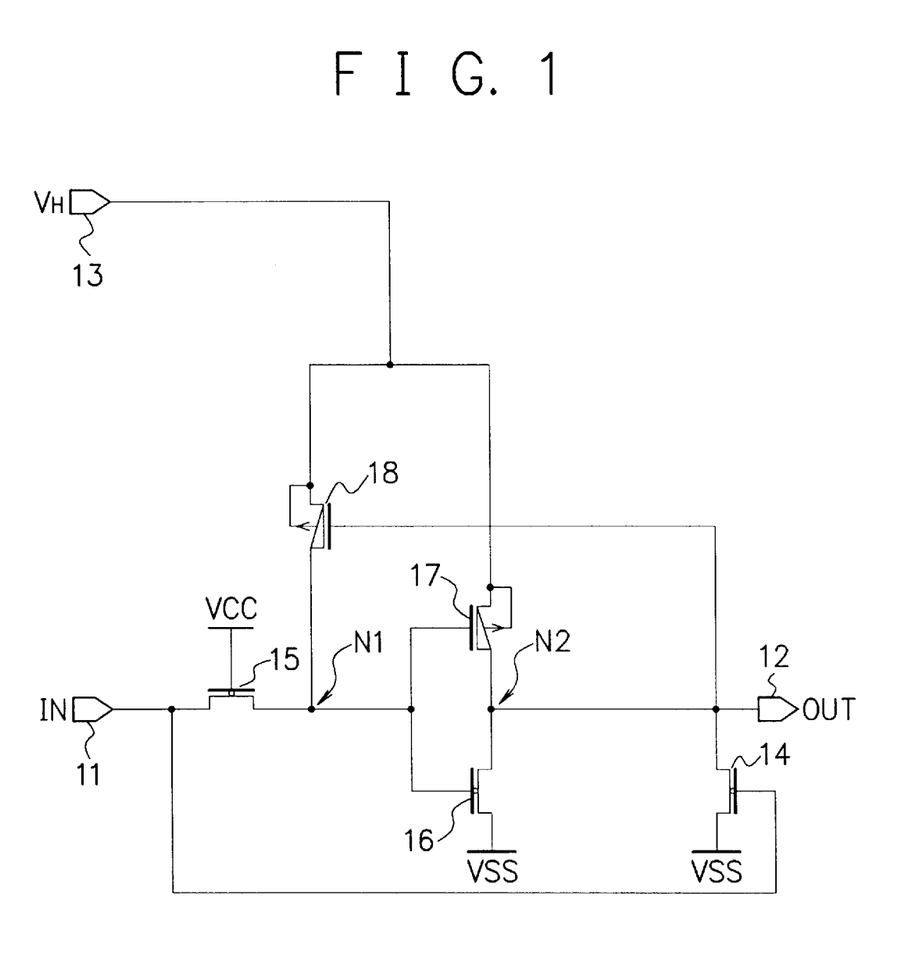
FIG. 1 is a diagram showing the configuration of a switching circuit to which the semiconductor circuit according to a first embodiment of the present invention is applied.

FIG. 1 is a diagram showing the configuration of a switching circuit to which the semiconductor circuit according to a first embodiment of the present invention is applied.

In FIG. 1, the reference numeral 11 designates an input terminal for inputting an input signal IN of binary logic to be represented by a power supply voltage VCC or a reference voltage VSS (in the present embodiment, a ground potential). The reference numeral 12 designates an output terminal for outputting an output signal OUT, and 13 an output signal voltage supply terminal for supplying an output signal voltage $V_H$ different from the power supply voltage VCC ($V_H$ >VCC). The reference numerals 14, 15, and 16 designate Nch-Trs; 17 and 18 Pch-Trs. Incidentally, the above-mentioned Nch-Trs 14, 15, 16, and Pch-Tr 17, 18 are composed of CMOS transistors.

The input terminal 11 is connected to both the gate of the Nch-Tr 14 and the source of the Nch-Tr 15. The Nch-Tr 14 having its gate connected to the input terminal 11 is connected at its source to a reference voltage VSS and at its drain to the drain of the Nch-Tr 16.

The Nch-Tr 15 having its source connected to the input terminal 11 is connected at its gate to a power supply voltage VCC and at its drain to the drain of the Pch-Tr 18. The interconnection node N1 between the drain of the Nch-Tr 15 and the drain of the Pch-Tr 18 is also connected with the gate of the Nch-Tr 16 and the gate of the Pch-Tr 17.

The Nch-Tr 16 having its gate connected to the interconnection node N1 is connected at its source to the reference voltage VSS (in the present embodiment, a ground potential). The source and substrate electrode of the Pch-Tr 17 are connected to the output signal voltage supply terminal 13. The interconnection node N2 between the drain of the Nch-Tr 14 and the drain of the Nch-Tr 16 is connected with the output terminal 12, the drain of the Pch-Tr 17, and the gate of the Pch-Tr 18. The source and substrate electrode of the Pch-Tr 18 are connected to the output signal voltage supply terminal 13.

Next, description will be given of operations.

To begin with, suppose that a predetermined time has elapsed since an input signal IN carrying the reference voltage VSS (low level) was input through the input terminal 11, and that the switching circuit shown in FIG. 1 is in a steady state. Here, the reference voltage VSS is applied to the gates of the Nch-Trs 14, 16 and the Pch-Tr 17, so that the Nch-Trs 14, 16 are OFF and the Pch-Tr 17 is ON. The interconnection node N2 therefore becomes the output signal voltage $V_H$ in potential, outputting an output signal OUT carrying the output signal voltage $V_H$ (high level) through the output terminal 12. Besides, the output signal voltage $V_H$ is applied to the gate of the Pch-Tr 18, so that the Pch-Tr 18 turns OFF and the interconnection node N1 becomes the reference voltage VSS in potential.

Now, when the input signal IN changes from the reference voltage VSS (low level) to the power supply voltage VCC (high level), the power supply voltage VCC is applied to each of the gates of the Nch-Trs 14, 16 and the Pch-Tr 17. As a result, the Nch-Tr 14 undergoing the power supply voltage VCC at its gate changes from OFF to ON, lowering the potential of the interconnection node N2. Accordingly, the output signal OUT to be output from the output terminal 12 also decreases in voltage.

The Nch-Tr 16 similarly undergoing the power supply voltage VCC at its gate changes from OFF to ON while the Pch-Tr 17 remains ON with a decrease in driving power.

Then, as the interconnection node N2 lowers in potential, the Pch-Tr 18 having its gate connected to the interconnection node N2 changes from OFF to ON, so that the interconnection node N1 turns from the power supply voltage VCC to the output signal voltage $V_H$ in potential. This applies the output signal voltage $V_H$ to the gates of the Nch-Tr 16 and the Pch-Tr 17, enhancing the ON and OFF characteristics of the Nch-Tr 16 and the Pch-Tr 17, respectively. That is, the Nch-Tr 16 increases in driving power. The Pch-Tr 17 turns from ON to OFF. Accordingly, the voltage of the output signal OUT to be output from the output terminal 12 quickly falls to the reference voltage VSS.

Subsequently, the Nch-Trs 14, 16 and the Pch-Tr 18 remain ON and the Pch-Tr 17 remains OFF as long as the input signal IN carries the power supply voltage VCC (high level). Moreover, during this period, the interconnection node N1 has a potential of the output signal voltage $V_H$, and the interconnection node N2 has a potential of the reference voltage VSS.

Next, when the input signal IN changes from the power supply voltage VCC (high level) to the reference voltage VSS (low level), the reference voltage VSS is applied to the gate of the Nch-Tr 14, changing the Nch-Tr 14 from ON to OFF. The change of the input signal IN to the reference voltage VSS also lowers the interconnection node N1 in potential so that the gates of the Nch-Tr 16 and the Pch-Tr 17 eventually undergo the reference voltage VSS. Therefore, the Nch-Tr 16 changes from ON to OFF, and the Pch-Tr 17 from OFF to ON. As a result, the interconnection node N2 reaches the output signal voltage $V_H$ in potential. This turns the Pch-Tr 18 from ON to OFF, and outputs an output signal OUT carrying the output signal voltage $V_H$ (high level) through the output terminal 12.

Figure 2:
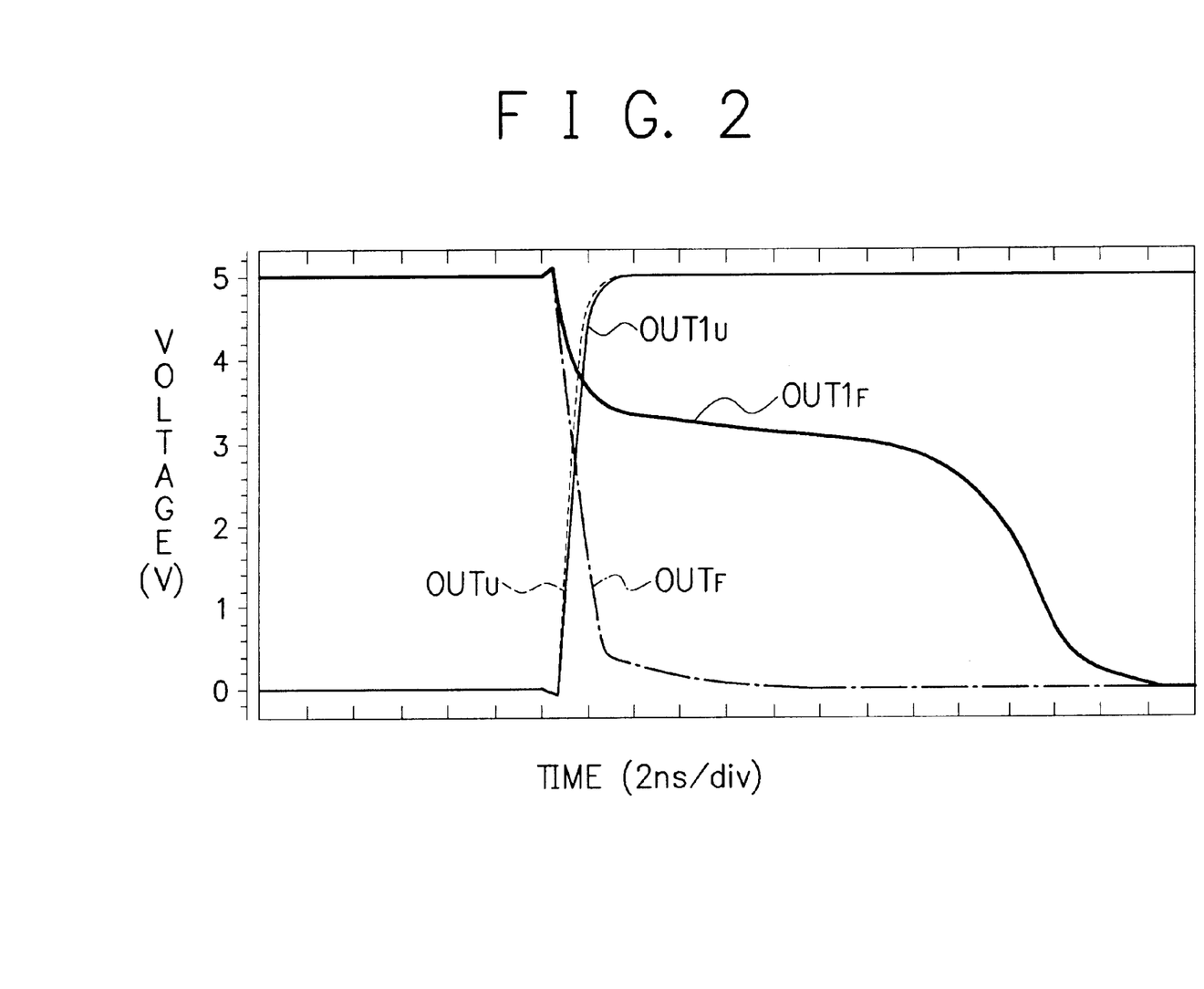
FIG. 2 is a chart showing the output signals from the switching circuit to which the semiconductor circuit according to the first embodiment is applied, and the output signals from a conventional switching circuit shown in FIG. 5.
Figure 3:
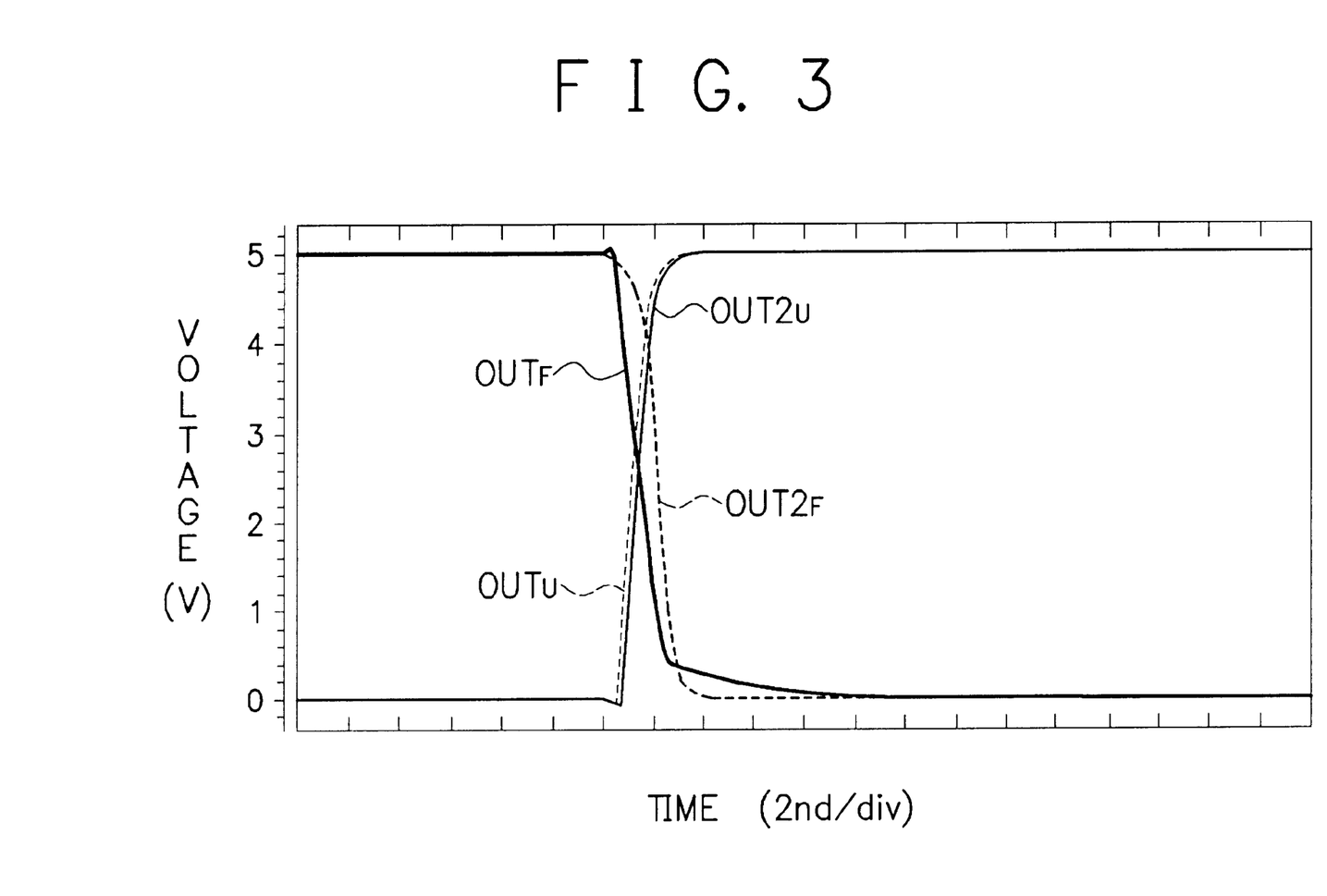
FIG. 3 is a chart showing the output signals from the switching circuit to which the semiconductor circuit according to the first embodiment is applied, and the output signals from a conventional switching circuit shown in FIG. 6.

FIGS. 2 and 3 are diagrams showing the results of simulation on the output signal OUT from the switching circuit shown in FIG. 1 described above. To compare the results of simulation on the output signal OUT with the output signals OUT1 and OUT2 from the conventional switching circuits shown in FIGS. 5 and 6, respectively, FIG. 2 also shows the results of simulation on the output signal OUT1 from the switching circuit shown in FIG. 5. FIG. 3 also shows the results of simulation on the output signal OUT2 from the switching circuit shown in FIG. 6.

Incidentally, the results of simulation shown in FIGS. 2 and 3 were obtained from simulations performed under a power supply voltage VCC of 2 V, an output signal voltage $V_H$ of 5 V, and a reference voltage VSS of 0 V.

In FIG. 2, the ordinate represents voltage, and the abscissa represents time. The time axis is graduated in steps of 2 ns. The output signals $OUY_U$ and $OUT1_u$ are the output signals from the switching circuits shown in FIGS. 1 and 5, respectively, for situations where the input signal IN is changed from the power supply voltage VCC to the reference voltage VSS. Similarly, the output signals $OUT_F$ and $OUT1_F$ are the output signals from the switching circuits shown in FIGS. 1 and 5, respectively, for situations where the input signal IN is changed from the reference voltage VSS to the power supply voltage VCC.

As shown in FIG. 2, when the input signal IN is changed from the power supply voltage VCC to the reference voltage VSS, the output signals $OUY_U$ and $OUT1_u$ show no significant difference therebetween. That is, the switching circuits shown in FIGS. 1 and 5 have no significant difference between their switching capabilities of switching the output signals $OUY_U$ and $OUT1_u$ from the reference voltage VSS into the output signal voltage $V_H$. On the other hand, when the input signal IN is changed from the reference voltage VSS to the power supply voltage VCC, the output signal OUT1$_F$ takes a longer time of the order of 20 ns to shift from the output signal voltage V$_H$ to the reference voltage VSS. In contrast, the output signal OUT$_F$ changes from the output signal voltage V$_H$ to the reference voltage VSS quickly within 2 ns. Thus, it is clear that the switching circuit shown in FIG. 1 has an extremely higher switching capability of switching the output signal OUT from the output signal voltage V$_H$ into the reference voltage VSS as compared with the switching circuit shown in FIG. 5, and that the switching circuit shown in FIG. 1 is effective.

The reason for this is as follows. In the switching circuit shown in FIG. 5, the Nch-Tr 54 for lowering the voltage of the output signal OUT1 is always turned ON by the power supply voltage VCC (2 V). On the contrary, in the switching circuit of FIG. 1, the Nch-Tr 14 to be always turned ON by the power supply voltage VCC (2 V) is accompanied by the Nch-Tr 16 to be brought into a high-driving-power ON state by the output signal voltage V$_H$ (5 V) after a lapse of predetermined time (1 ns or so) since the turning-ON of the Nch-Tr 14. This Nch-Tr 16 can lower the voltage of the output signal OUT for high speed switching.

In FIG. 3, the ordinate represents voltage, and the abscissa represents time. The time axis is graduated in steps of 2 ns. The output signals OUY$_U$ and OUT2$_U$ are the output signals from the switching circuits shown in FIGS. 1 and 6, respectively, for situations where the input signal IN is changed from the power supply voltage VCC to the reference voltage VSS. Similarly, the output signals OUT$_F$ and OUT2$_F$ are the output signals from the switching circuits shown in FIGS. 1 and 6, respectively, for situations where the input signal IN is changed from the reference voltage VSS to the power supply voltage VCC.

As shown in FIG. 3, when the input signal IN is changed from the power supply voltage VCC to the reference voltage VSS, the output signals OUT$_U$ and OUT2$_U$ show no great difference therebetween. When the input signal IN is changed from the reference voltage VSS to the power supply voltage VCC, the output signals OUT$_F$ and OUT2$_F$ show no significant difference again, while the output signal OUT$_F$ changes from the output signal voltage V$_H$ to the reference voltage VSS somewhat faster than the output signal OUT2$_F$ does. Therefore, between the switching circuits shown in FIGS. 1 and 6, no significant difference is found in their switching capabilities of switching the output signal OUT and OUT2 between the reference voltage VSS and the output signal voltage V$_H$.

Note, however, that the switching circuit shown in FIG. 1 can be composed of as few as five transistors. That is, it is possible to offer the switching capability equivalent to that of the switching circuit shown in FIG. 6 while reducing the circuit area as compared with the switching circuit of FIG. 6 which consists of at least eight transistors.

As has been described in detail, according to the first embodiment, the Nch-Tr 14 connected at its gate to the input terminal 11 and the Nch-Tr 16 connected at its gate to the output signal voltage supply terminal 13 through the Pch-Tr 18 are connected to the output terminal 12 for outputting an output signal OUT having a signal voltage level of the output signal voltage V$_H$. Then, in switching the output signal OUT from the output signal voltage V$_H$ (high level) to the reference voltage VSS (low level) as the input signal IN changes from the reference voltage VSS (low level) to the power supply voltage VCC (high level), the power supply voltage VCC from the input signal IN is initially applied to the gates of the Nch-Trs 14 and 16 before the output signal voltage V$_H$ is applied to the gate of the Nch-Tr 16.

As a result, the Nch-Trs 14 and 16 receiving the power supply voltage VCC at their gates turn ON to lower the voltage of the output signal OUT, and then the Nch-Tr 16 receiving the output signal voltage V$_H$ at its gate enters a high ON state (a state of higher driving power) so that the voltage of the output signal OUT can be switched into the reference voltage VSS (low level) quickly. Therefore, in accordance with a change in the input signal IN, the output signal OUT can be quickly changed into the reference voltage VSS or the output signal voltage V$_H$ for favorable switching characteristics. Moreover, since it contains only one additional transistor to those constituting the conventional switching circuit shown in FIG. 5, the switching circuit shown in the present embodiment can be formed in a smaller circuit area. Besides, as compared with the switching circuit shown in FIG. 6, the switching circuit shown in the present embodiment has an extremely smaller number of transistors to constitute the circuitry. Therefore, the switching characteristics equivalent to those of the switching circuit shown in FIG. 6 can be obtained even with a reduction in circuit area.

Second Embodiment

In the above-described switching circuit to which the semiconductor circuit according to the first embodiment is applied, the output signal voltage V$_H$ higher than the power supply voltage VCC is often applied to the Nch-Trs 14 and 16 through the Pch-Tr 17. This requires that the Nch-Trs 14 and 16 be high-voltage transistors with higher withstand voltages (such as thick-film transistors), complicating the circuit design of the switching circuit and possibly causing a delay in the characteristics of the switching circuit. With this in view, a second embodiment is to interpose a new Nch-Tr for preventing the output signal voltage V$_H$ from being applied to the Nch-Trs 14 and 16 to the Pch-Tr 17 and the Nch-Trs 14, 16 so that these Nch-Trs 14, 16 may be composed of easy-of-circuit-design thin-film transistors for the sake of improved characteristics of the switching circuit.

Figure 4:
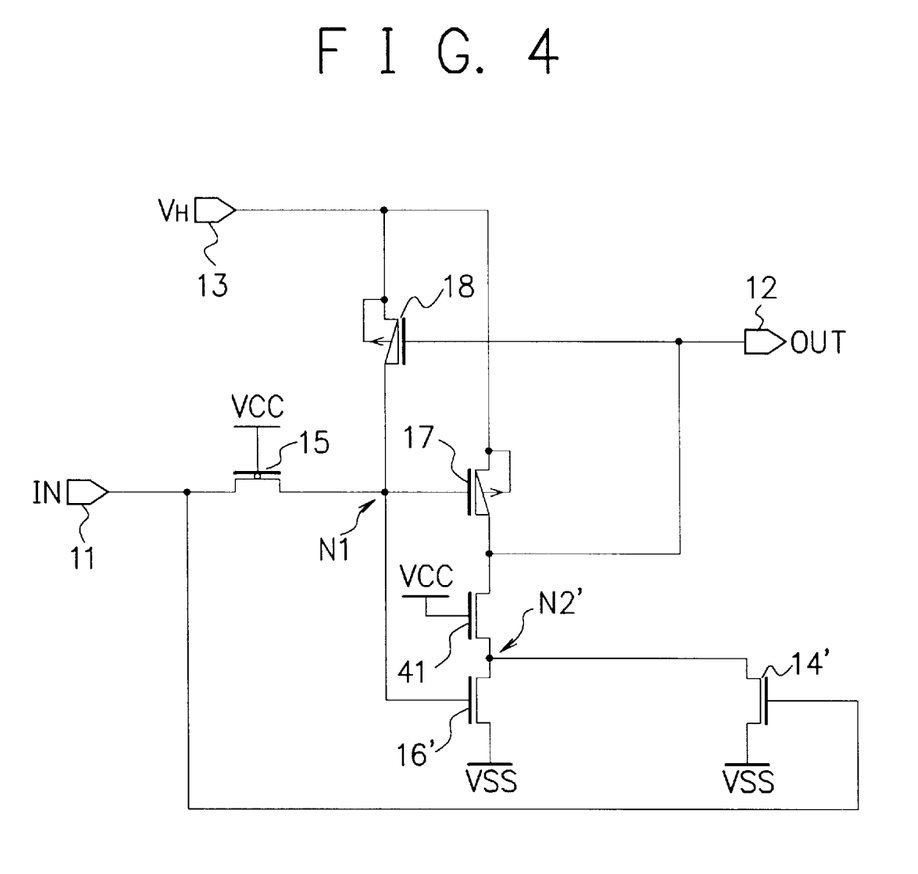
FIG. 4 is a diagram showing the configuration of a switching circuit to which the semiconductor circuit according to a second embodiment of the present invention is applied.

FIG. 4 is a diagram showing the configuration of a switching circuit to which the semiconductor circuit according to a second embodiment of the present invention is applied. In this FIG. 4, those parts having the same functions as in the configuration shown in FIG. 1 will be designated by identical reference numerals. Repetitive description thereof will be omitted here. Moreover, those parts corresponding and not identical to the ones shown in FIG. 1 will be designated by identical reference numerals with an apostrophe.

In FIG. 4, the reference numeral 14' designates an Nch-Tr which is connected at its gate to the input terminal 11, at its source to the reference voltage VSS (in the present embodiment, a ground potential), and at its drain to the drain of an Nch-Tr 16'. The Nch-Tr 16' is connected at its gate to the interconnection node N1, and at its source to the reference voltage VSS (in the present invention, a ground potential). The interconnection node N2' between the drain of the Nch-Tr 14' and the drain of the Nch-Tr 16' is connected with the source of an Nch-Tr 41 which is connected at its gate to the power supply voltage VCC. Then, the drain of the Nch-Tr 41 is connected with the output terminal 12, the drain of the Pch-Tr 17, and the gate of the Pch-Tr 18.

When the switching circuit is configured as shown in FIG. 4 described above, the Nch-Tr 41 always maintains the potential of the interconnection node N2', or the voltage to be applied to the drains of the Nch-Trs 14' and 16', below or equal to the power supply voltage VCC even if the input signal IN is changed to the reference voltage VSS from the power supply voltage VCC. This eliminates the necessity to use high-voltage transistors with higher withstand voltages for the Nch-Trs 14' and 16'.

Incidentally, in the switching circuit shown in FIG. 4, the operation of switching the signal level of the input signal IN input through the input terminal 11 from the power supply voltage level to the output voltage level and outputting the resultant as the output signal OUT is the same as in the switching circuit of the first embodiment shown in FIG. 1. Thus, description thereof will be omitted here.

As has been described, according to the second embodiment, the new Nch-Tr 41 is arranged between the Pch-Tr 17 and the Nch-Trs 14', 16' so that the drains of the Nch-Trs 14', 16' are prevented from being supplied with a voltage higher than the power supply voltage VCC. This means an effect, in addition to those of the first embodiment, that the switching circuit can be composed of thin-film transistors without using high-voltage transistors for the Nch-Trs 14' and 16'. Therefore, transistors having gate lengths according to the process technologies can be used to facilitate the circuit design of the switching circuit and achieve a reduction in circuit area.

The first and second embodiments described above have dealt with the cases where the input signal IN is a signal carrying the level of the power supply voltage VCC. Nevertheless, the present invention is not limited to the input signal IN carrying the level of the power supply voltage VCC, and may be applied to input signals IN having any voltage levels.

Moreover, while the first and second embodiments have dealt with the cases where the reference voltage VSS is a ground potential, the present invention is not limited to the ground potential.

Note that the above-described embodiments have shown just a few examples of embodiment in practicing the present invention, and should not be considered as restrictive of the technical scope of the present invention. That is, the present invention may be practiced in various forms without departing from the technical philosophy and principle features thereof.

As has been described, according to the present invention, both the first N-channel transistor having a gate connected to the input terminal, a drain connected to the output terminal, and a source connected to the reference voltage supply terminal for supplying the reference voltage, and the second N-channel transistor having a drain connected to the output terminal, a source connected to the reference voltage supply terminal, and a gate connectable to the input terminal and the voltage supply terminal for supplying the second voltage are subjected to the first voltage at their gates before the second voltage is applied to the gate of the second N-channel transistor. Therefore, the first and second N-channel transistors can be initially turned ON to shift the signal level of the output signal to a predetermined level before the second N-channel transistor is further brought into a high ON state (a state of higher driving power) to switch the signal level of the output signal to the second voltage or the reference voltage so that the output signal according to the logic of the input signal is output. Therefore, favorable switching characteristics in switching signal voltage levels can be obtained from simpler circuit configurations. For example, when the semiconductor circuit of the present invention is adopted for a decoder circuit or the like in which identical circuit configurations are laid out repeatedly, favorable switching characteristics can be obtained with only a slight increase in circuit area since the number of circuit elements constituting this semiconductor circuit is small.

Besides, the circuit elements for eventually turning the output signal to the second voltage level have a circuit configuration free from fluctuations of the first voltage and the like. Therefore, the operation of switching an input signal having the first voltage level into an output signal having the second voltage level can be performed with stability.

What is claimed is:

1. A semiconductor circuit comprising:
    an input terminal capable of inputting an input signal of binary logic to be represented by a first voltage or a reference voltage;
    an output terminal capable of outputting an output signal to be represented by a second voltage or said reference voltage, corresponding to the logic of said input signal;
    a voltage supply terminal for supplying said second voltage;
    a first N-channel transistor having a gate connected to said input terminal, a drain connected to said output terminal, and a source connected to a reference voltage supply terminal for supplying said reference voltage; and
    a second N-channel transistor having a drain connected to said output terminal, a source connected to said reference voltage supply terminal, and a gate connectable to said input terminal and said voltage supply terminal;
    a third N-channel transistor having a drain connected to said output terminal, and the drains of said first and second N-channel transistors both connected to the source of said third N-channel transistor;
    said first voltage being applied to the gate of said third N-channel transistor, and
    said first voltage being applied to the gates of said first and second N-channel transistors before said second voltage is applied to the gate of said second N-channel transistor to output an output signal represented by said second voltage or said reference voltage through said output terminal.

2. The circuit according to claim 1, wherein said second voltage is a voltage higher than said first voltage.

3. The circuit according to claim 1, wherein said reference voltage is a ground potential.

4. The circuit according to claim 1, wherein:
    said first voltage is a power supply voltage of the semiconductor circuit;
    said second voltage is a voltage higher than said first voltage; and
    said reference voltage is a ground potential.

5. A semiconductor circuit comprising:
    an input terminal for inputting an input signal;
    an output terminal for outputting an output signal;
    a first N-channel transistor having a gate connected to said input terminal and a source connected to a reference voltage supply terminal for supplying a reference voltage;
    a second N-channel transistor having a source connected to said input terminal and a gate connected to a first voltage:supply terminal for supplying a first voltage;
    a first P-channel transistor having a drain connected to a drain of said second N-channel transistor, a gate connected to said output terminal, and a source connected to a second voltage supply terminal for supplying a second voltage;

a second P-channel transistor having a gate connected to the interconnection node between the drain of said second N-channel transistor and the drain of said first P-channel transistor, a source connected to said second voltage supply terminal, and a drain connected to said output terminal;

a third N-channel transistor having a gate connected to the interconnection node between the drain of said second N-channel transistor and the drain of said first P-channel transistor and a source connected to said reference voltage supply terminal; and a fourth N-channel transistor having a gate connected to said first voltage supply terminal, a source connected to a drain of said first N-channel transistor and a drain of said third N-channel transistor, and a drain connected to said output terminal.

6. The circuit according to claim 5, wherein said first and second N-channel transistors are composed of thin-film transistors.

7. The circuit according to claim 5, wherein said second voltage is a voltage higher than said first voltage.

8. The circuit according to claim 5, wherein said reference voltage is a ground potential.

9. The circuit according to claim 5, wherein:

said first voltage is a power supply voltage of the semiconductor circuit;

said second voltage is a voltage higher than said first voltage;

said reference voltage is a ground potential.

10. The circuit according to claim 5, consisting of CMOS transistors.

* * * * *